United States Patent
Miyashita

(10) Patent No.: US 7,192,821 B2
(45) Date of Patent: Mar. 20, 2007

(54) MANUFACTURING PROCESS OF SEMI-CONDUCTOR DEVICE

(75) Inventor: Kazuyuki Miyashita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 104 days.

(21) Appl. No.: 11/061,440

(22) Filed: Feb. 22, 2005

(65) Prior Publication Data

US 2005/0186721 A1   Aug. 25, 2005

(30) Foreign Application Priority Data

Feb. 25, 2004  (JP) .............................. 2004-050391
Sep. 9, 2004   (JP) .............................. 2004-261824

(51) Int. Cl.
*H01L 21/336*  (2006.01)
*H01L 21/8234* (2006.01)

(52) U.S. Cl. .......................... 438/197; 438/154; 117/1

(58) Field of Classification Search ................ 438/154, 438/163, 164, 197; 117/1, 3, 4, 92
See application file for complete search history.

(56) References Cited

U.S. PATENT DOCUMENTS 5,766,344 A * 6/1998 Zhang et al. ............... 117/103
6,022,813 A * 2/2000 Kobayashi et al. ......... 438/778
6,096,585 A * 8/2000 Fukuda et al. ............. 438/154

FOREIGN PATENT DOCUMENTS

JP   A 3-289140   12/1991
JP   A 6-342757   12/1994

* cited by examiner

*Primary Examiner*—Phuc T. Dang
(74) *Attorney, Agent, or Firm*—Oliff & Berridge, PLC

(57) ABSTRACT

Exemplary embodiments discourage or prevent impurities from mixing in a film of a semiconductor layer in a manufacturing process of a semiconductor device. A manufacturing process of a semiconductor device includes first forming a semiconductor layer, second removing hydrogen from inside the semiconductor layer, and third terminating by combining elements such as hydrogen with a surface of the semiconductor layer through exposure to hydrogen plasma and the like. At least the second removing and the third terminating are consecutively performed under an environment isolated from air. According to this process, it is possible to prevent or discourage impurities contained in air and the like from combining on the surface of the semiconductor film. It is possible to discourage or prevent impurities from mixing (diffusing) in the semiconductor layer in crystallization through irradiation by light following the third terminating.

11 Claims, 12 Drawing Sheets

MANUFACTURING PROCESS OF SEMI-CONDUCTOR DEVICE

BACKGROUND

The exemplary embodiments relate to a manufacturing process of a semiconductor device and particularly to a manufacturing process of thin film transistor.

A related art manufacturing process of a thin film transistor that is usable as a semiconductor includes, for example, forming a semiconductor layer which will later become a channel of a transistor, and crystallizing the semiconductor layer by way of irradiation by light (especially, laser). These steps are performed in different devices, and a substrate is exposed to air among these steps, so that impurities, such as hydrocarbons, boron, phosphor and water, are combined on a surface of the semiconductor layer. Consequently, there is a problem in which large quantities of impurities are mixed in a film of the semiconductor layer through fusion and solidification of the semiconductor layer by the above-mentioned crystallization.

To address or resolve this problem, for example, Japanese Unexamined Patent Publication No. Hei3-289140 discloses a process in which the forming of the semiconductor layer and the laser crystallization are performed consecutively without exposure to air.

Further, to reduce or prevent impurities from mixing into the semiconductor layer, for example, Japanese Unexamined Patent Publication No. Hei6-342757 discloses a process in which the forming the semiconductor layer, the dehydrogenation processing by annealing or heating with an infra-red lamp and the like, and the laser crystallization, are performed consecutively without exposure to air.

SUMMARY

However, even though the above-mentioned semiconductor layer forming, dehydrogenation processing, laser crystallization and the like of the related art are performed consecutively without exposure to air, impurities exist in the chamber, so that the impurities in the semiconductor layer may not be reduced much.

Accordingly, the exemplary embodiments provide a manufacturing process of a semiconductor device which can further reduce, minimize and/or eliminate the impurities in the semiconductor layer.

The manufacturing process of a semiconductor device of the exemplary embodiments include first forming a thin film semiconductor layer, second performing dehydrogenation processing to remove hydrogen from inside the above-mentioned semiconductor layer, and third combining an atom (element) or a molecule on a surface of the semiconductor layer activated by the dehydrogenation processing to terminate a connector of the surface of the semiconductor layer. At least the second performing and the third combining are consecutively performed under an environment isolated from air.

According to the above-mentioned process, the surface of the semiconductor layer is inactivated, so that the impurities in air and in the atmosphere of the semiconductor manufacturing apparatus may be prevented from combining on the semiconductor surface.

Further, the manufacturing process of the semiconductor device of the exemplary embodiments include first forming a thin film semiconductor layer under an environment which may include hydrogen, second removing hydrogen from inside the above-mentioned semiconductor layer following the above-mentioned first forming and third combining an atom (element) or a molecule on the surface of the above-mentioned semiconductor layer to terminate a connector on the surface of the semiconductor layer. At least the second removing and the third combining are consecutively performed under the environment isolated from air. The process further includes fourth further irradiating the above-mentioned semiconductor layer by light to perform crystallization of the semiconductor layer following the third combining.

According to the above process, while there is a condition in which the impurities existing in air and in the atmosphere in the semiconductor manufacturing apparatus are prevented from combining on the surface of the semiconductor layer, it is possible to perform crystallization of the semiconductor layer.

Additionally, the manufacturing process of the semiconductor device of the exemplary embodiment includes fourth performing crystallization by further irradiating the above-mentioned semiconductor layer by light, following the above-mentioned third combining. The above-mentioned fourth performing is preferably performed consecutively under the environment away from air.

According to the above process, while there is a condition in which the impurities existing in air and in the atmosphere in the semiconductor manufacturing apparatus are inhibited or prevented from combining on the surface of the semiconductor layer, it is possible to perform crystallization of the semiconductor layer with good flatness.

Further, the manufacturing process of the semiconductor device of the exemplary embodiments is such that as the above-mentioned third combining, the connector of the surface of the semiconductor layer is terminated by hydrogen through exposing the semiconductor layer to hydrogen plasma.

According to the above-mentioned process, a dangling bond on the surface of the semiconductor layer is terminated and inactivated, so that the impurities contained in the atmosphere may be prevented from combining on the surface of the semiconductor film.

Further, the manufacturing process of the semiconductor device of the exemplary embodiments is such that as the above-mentioned third combining (terminating processing), the surface of the semiconductor layer is subjected to heating under an atmosphere containing hydrogen.

According to the above-mentioned process, the dangling bond on the surface of the semiconductor film from which hydrogen is removed is terminated and inactivated, so that the impurities contained in air may be discouraged or prevented from combining on the surface of the semiconductor film.

Further, the manufacturing process of the semiconductor device of the exemplary embodiment is such that as the above-mentioned third combining (terminating processing), the surface of the semiconductor layer is subjected to exposure under the atmosphere containing hydrogen.

According to the above-mentioned process, the dangling bond on the surface of the semiconductor film from which hydrogen is removed is terminated and inactivated, so that the impurities contained in air may be discouraged or prevented from combining on the surface of the semiconductor film.

Further, the manufacturing process of the semiconductor device of the exemplary embodiment is such that as the above-mentioned third combining (terminating processing), the surface of the semiconductor layer is subjected to exposure in oxygen plasma.

According to the above-mentioned process, the dangling bond on the surface of the semiconductor layer from which hydrogen is removed is terminated and inactivated by oxygen, so that the impurities contained in the atmosphere may be discouraged or prevented from combining on the surface of the semiconductor film.

Further, the manufacturing process of the semiconductor device of the exemplary embodiments is such that as the above-mentioned third combining (terminating processing), the surface of the above-mentioned semiconductor layer is subjected to exposure in nitrogen plasma.

According to the above-mentioned process, the dangling bond on the surface of the semiconductor film from which hydrogen is removed is terminated and inactivated by nitrogen, so that the impurities contained in air may be discouraged or prevented from combining on the surface of the semiconductor film.

Further, the manufacturing process of the semiconductor device of the exemplary embodiment is such that as the above-mentioned third combining (terminating processing), the surface of the semiconductor layer is subjected to exposure in ammonia plasma.

According to the above-mentioned process, the dangling bond on the surface of the semiconductor film from which hydrogen is removed is terminated and inactivated by using at least one of nitrogen, hydrogen, and $NH_x$ (x equals 1 or 2), so that the impurities contained in air may be prevented or discouraged from combining on the surface of the semiconductor film.

DETAILED DESCRIPTION OF EMBODIMENTS

First, a description of the exemplary embodiments is made by taking a silicon semiconductor as an example.

Figure 8A:
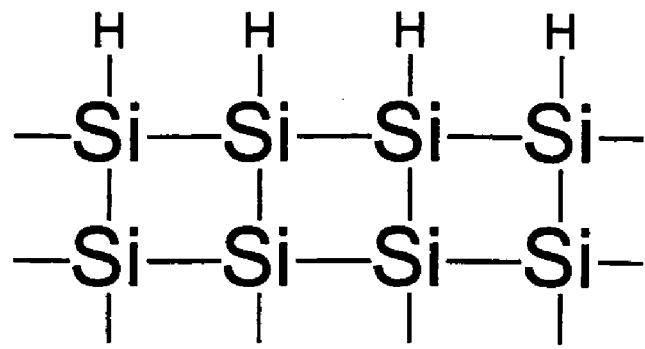
FIGS. 8A–8C are explanatory schematics of an exemplary embodiment.
Figure 8B:
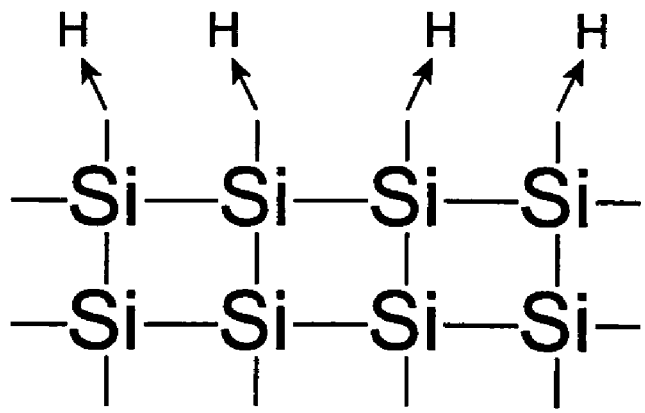
Figure 8C:
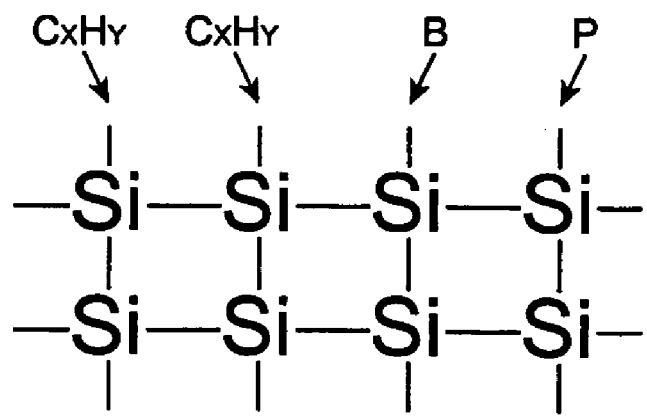

The dangling bond of a silicon atom on the surface of a silicon (semiconductor) layer which was made into a film by the CVD process and the like is that a hydrogen atom is combined with the silicon atom, as shown in FIG. 8A. Further, a large number of hydrogen atoms are included in the silicon layer. When carrying out laser crystallization to this silicon film, it is necessary to reduce the hydrogen atoms contained in the silicon layer to a level of about 1 at. % (dehydrogenation processing). However, if the hydrogenation processing shown in FIG. 8B is performed in this condition, the hydrogen atoms on the surface of the surface of the semiconductor layer are removed to make the surface activated, so that, as shown FIG. 8C, the condition becomes such that impurities such as hydrocarbons, water, phosphor, and boron existing in the atmosphere should be easy to be adsorbed.

Figure 9:
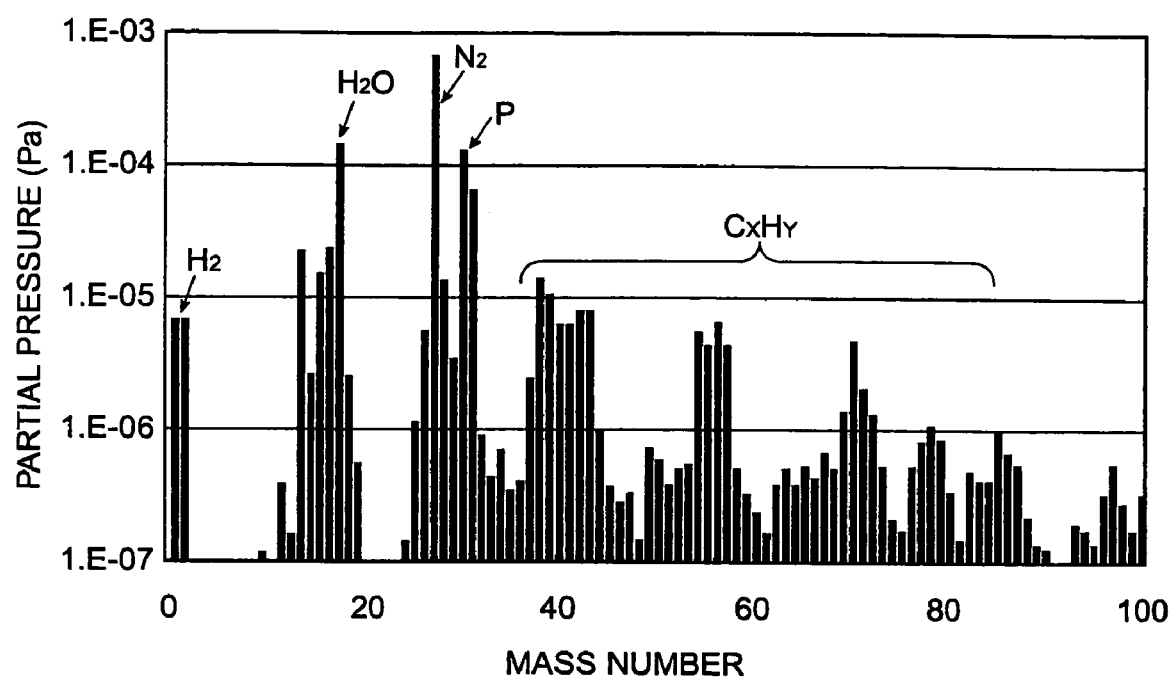
FIG. 9 is an explanatory schematic explaining existence of impurities in the atmosphere in an exemplary embodiment.

As shown in FIG. 9, there are impurities such as hydrocarbons, water, phosphor, and boron existing, though in minute quantities, in the atmosphere of the process, and these partial pressures become extremely high in high vacuum. If laser crystallization is performed in such condition, the impurities combined with the dangling bond diffuse in the polysilicon semiconductor layer, thus causing adverse effect on the electrical characteristics of the thin-film transistor.

Hence, in the exemplary embodiment, during the process from the forming the semiconductor layer to the performing laser crystallization, the connector (dangling bond) on the surface activated after dehydrogenation (removing impurities) processing of the semiconductor layer is subjected to termination processing to inactivate the surface, thereby preventing or discouraging the impurities from mixing in the semiconductor film.

WORKING EXAMPLE 1

Figure 3:
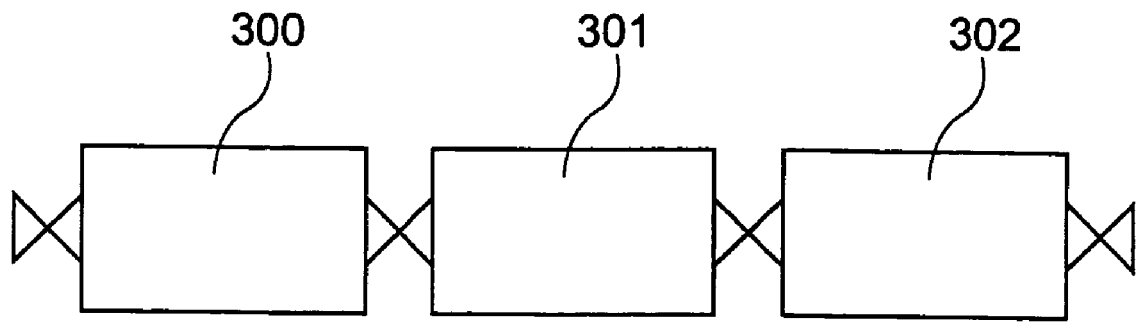
FIG. 3 is an explanatory schematic explaining transfer of devices among processes in Working Examples 1, 3, and 4 in exemplary embodiments.

Working Example 1 will be described with reference to FIGS. 1A–1G and FIG. 3. FIGS. 1A–1G are process schematics explaining a manufacturing process of a thin-film transistor of the Working Example 1 of the exemplary embodiments. FIG. 3 is an explanatory schematic explaining transfer of a device among processes.

As described later, in the Working Example 1, the termination processing of the surface of the semiconductor layer is performed through exposure to hydrogen plasma.

Figure 1A:
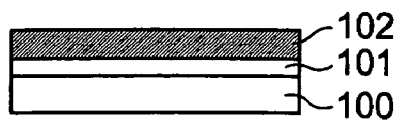
FIGS. 1A–1G are process schematics explaining a manufacturing process of a thin film transistor in Working Example 1 in an exemplary embodiment.

As shown in FIG. 1A, as the first step, a base protective film 101 which is an insulating material is first deposited on a substrate 100. For the substrate 100, a rectangular, general-purpose non-alkali glass substrate 100, 300 mm×300 mm, is used. In the present example, with a substrate temperature set at 430° C., by way of a parallel flat plate plasma CVD process, a silicon oxide film is deposited in a thickness of about 500 nm. Next, there is deposited a semiconductor film 102 of an intrinsic silicon film and the like which will later become a channel layer of the thin-film transistor. In the present example, consecutively with the deposit of the base protective film 101, a deposit is made by the parallel flat plate plasma CVD process in the same chamber. After depositing the base protective film 101, first, degassing and Ar charging are repeated twice to replace the inside of the chamber with Ar, and the gas such as $O_2$ and the like used when forming the base protective film is discharged out of the chamber. Next, 1000 sccm of a raw material gas, silane (SiH$_4$), is run, whereas by processing for 60 seconds at a deposit temperature of 430° C., an amorphous silicon film 102 is deposited in a thickness of approximately 50 nm.

Next, as the second step (dehydrogenation processing), to remove hydrogen, the substrate is conveyed in vacuum (under a decompressed environment) to a dehydrogenation processing chamber 300 shown in FIG. 3, where substrate heating is performed for 10 minutes at 490° C. By this way, a hydrogen content in the semiconductor film becomes about 1 atm. %, thereby enabling laser crystallization.

Figure 1B:
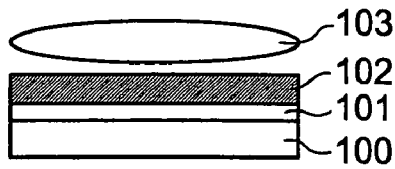

Next, as shown in FIG. 1B, as the third step (termination processing), the substrate is conveyed from the dehydrogenation processing chamber 300 to a termination processing chamber 301, as shown in FIG. 3, in vacuum (under the decompressed environment), and hydrogen plasma processing 103 is performed on the amorphous silicon film 102, First, the substrate is set in the plasma processing chamber, and hydrogen gas is introduced into this chamber. For example, a 99.999% hydrogen gas is introduced from a mass flow controller at a gas flow rate of 1000 sccm. Pressure in the processing chamber is adjusted to be 1 torr. Once the gas pressure in the chamber is stabilized, RF discharge is started, terminating a surface of the amorphous silicon film with hydrogen. For example, the substrate temperature is 350° C. and the RF power charged is 0.05 W/cm$^2$. By a generated active seed, the surface of the amorphous silicon film is sufficiently inactivated in a processing time of 10 seconds.

Figure 10A:
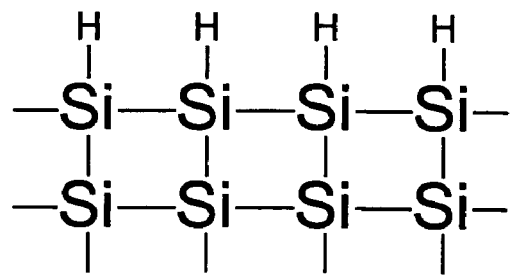
FIGS. 10A–10D are explanatory schematics explaining termination processing in an exemplary embodiment.
Figure 10B:
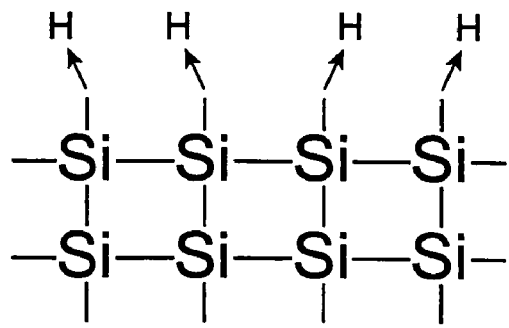
Figure 10C:
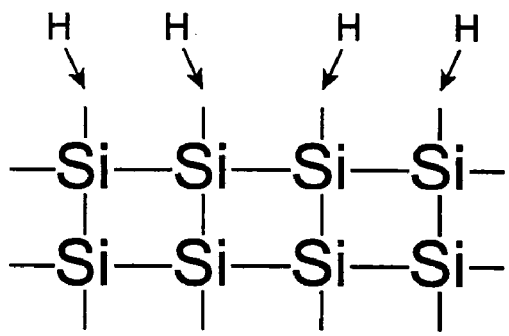
Figure 10D:
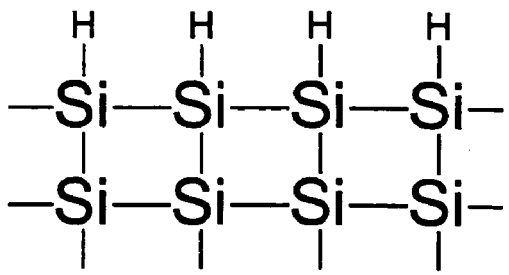

Referring to FIGS. 10A–10D, removal of hydrogen by the second step and termination processing of the semiconductor layer through hydrogen by the third step, as mentioned above, will be described. On the surface of the semiconductor layer formed under the environment, which may contain hydrogen, such as the CVD process using silane gas which may contain hydrogen, as shown in FIG. 10A, the hydrogen atoms are united with the dangling bonds of the silicon atoms. If dehydrogenation processing, as shown in FIG. 10B, is performed in this condition, the surface from which hydrogen of the surface of the semiconductor layer is removed is activated and the impurities in vacuum are united. Consequently, termination is made with hydrogen elements as shown in FIG. 10C and FIG. 10D.

Figure 1C:
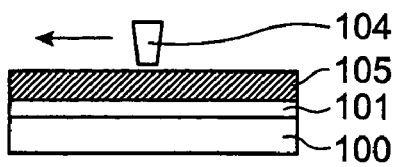

Next, as shown in FIG. 1C, as the fourth step, the semiconductor layer is conveyed in vacuum (under the decompressed environment) to a light irradiation chamber 302 shown in FIG. 3, and crystallization is performed through irradiation by a laser beam 104. In the present example, an excimer laser (wavelength: 308 nm) of xenon chloride (XeCl) is irradiated. A half-value width (half-value with respect to time) of intensity of a laser pulse is 25 ns. An area of laser irradiation is a line shape of 150 nm long×0.4 mm wide, and an energy density on the irradiated surface is 420 mJ/cm$^2$. This laser beam is being overlapped per 96.25% (that is, every 15 μm whenever irradiation is made) and relatively shifted for repeating irradiation. In this manner, the amorphous silicon film 102 of the entire substrate with one side 300 nm is converted to a crystallized silicon film 105.

In the foregoing processing, by inactivating the surface of the semiconductor layer, infiltration of impurities in air or in the atmosphere is discouraged or is prevented.

It should be noted that in the present Working Example, a separate space is set up respectively in the semiconductor deposition layer chamber, the dehydrogenation processing chamber 300, the termination processing chamber 301, and the light irradiation chamber 302. However, the same space may be used.

Figure 1D:
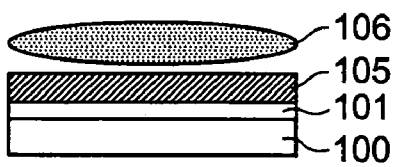

Next, as shown in FIG. 1D, plasma processing is performed to terminate a large amount of trap states introduced in large quantities to the crystallized silicon semiconductor layer. In the present example, after laser crystallization, consecutive plasma processing is performed without exposure to air in the same chamber as the above-mentioned plasma processing chamber. For oxygen plasma processing, the substrate is set in the plasma processing chamber, into which oxygen gas is introduced. For example, the 99.999% oxygen gas is introduced from the mass flow controller and the gas flow rate is set at 1000 sccm. Pressure inside the processing chamber is adjusted such that it is 1 torr. Once the gas pressure inside the chamber is stabilized, RF discharge is started, generating an oxygen plasma 106 to terminate the trap states of a poly-Si film. The substrate temperature is 350° C. and the F power charged is 0.15 W//cm$^2$. By using the active seed generated, the trap states of the poly-Si film are inactivated to a sufficiently low density in the processing time of 600 seconds. Oxygen plasma processing may be performed by first exposing it to air to be followed by processing by another apparatus. In this case, the process may include to rinse it in dilute hydrofluoric acid and the like to remove natural oxide film formed in the semiconductor layer prior to introducing it into the apparatus.

Figure 1E:
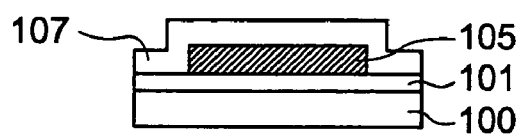

Next, as shown in FIG. 1E, etching is performed for element separation of the poly-Si film 105, then, a gate insulating film 107 is deposited. For example, silane gas and oxygen gas are introduced into the insulating film deposit chamber at a flow ratio of 1:6, and the pressure in the deposit chamber is adjusted to 2×10$^{-3}$ Torr. Once the gas pressure inside the chamber is stabilized, ECR discharge is started and film-making of the insulating film is started. The microwave power charged is 1 kW, and a microwave is introduced through an introduction window in parallel to a magnetic line. There is an ECR point located at a position 14 cm from the introduction window. Film-making is performed at a film-making rate of 100 nm/min. By this means, 100 nm of the gate insulating film 107 is deposited.

Figure 1F:
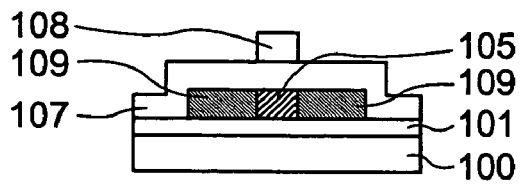

Next, as shown in FIG. 1F, a thin film which will become a gate electrode is deposited through a PVD process or the CVD process. Since the gate electrode and gate wiring are typically made of the same material in the same process, it is desirable for this material to have low electric resistance and to be stable against a heating step of 350° C. or thereabouts. In the present example, a tantalum thin film of a film thickness of 600 nm is deposited by a sputtering process. The substrate temperature when depositing the tantalum thin film is 180° C., and argon gas containing 6.7% of nitrogen gas is used for sputtering gas. The tantalum thin film deposited in this manner has a crystal structure of α structure, and its specific resistance is approximately 40 μΩcm. Patterning is performed, after depositing, on a thin film which is to become a gate electrode, and subsequently, an ion injection of impurities is performed on the semiconductor film to form a source/drain area 109 and a channel area 105. Since the gate electrode serves as a mask for the ion injection at this time, the channel has become a self-aligned structure to be formed only under the gate electrode. For raw material gas of an ion doping process, there is employed a hydrogen compound of injection impurities such as phosphine (PH$_3$) and diborane (B$_2$H$_6$) of a concentration of approximately 0.1% to 10%, which is diluted in hydrogen. In the present example, aiming at formation of NMOS, an ion doping device is used to inject phosphine (PH$_3$) of a 5% concentration diluted in hydrogen at an acceleration voltage of 100 keV. The total quantity of ion injection including PH$_3{}^+$ and H$_2{}^+$ ions is 1×10$^{16}$ cm$^{-2}$.

Figure 1G:
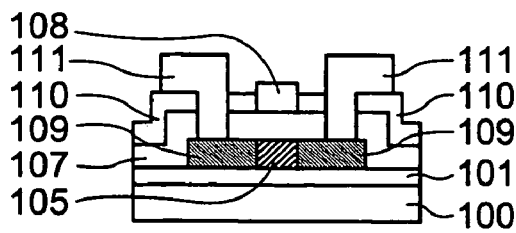

Next, as shown in FIG. 1G, an interlayer insulating film 110 is deposited, a contact hole is opened on the source/drain 109, and a source/drain take-out electrode 111 and wiring are formed by such processes as the PVD process and the sputtering process, thus completing a thin film transistor.

Figure 12:
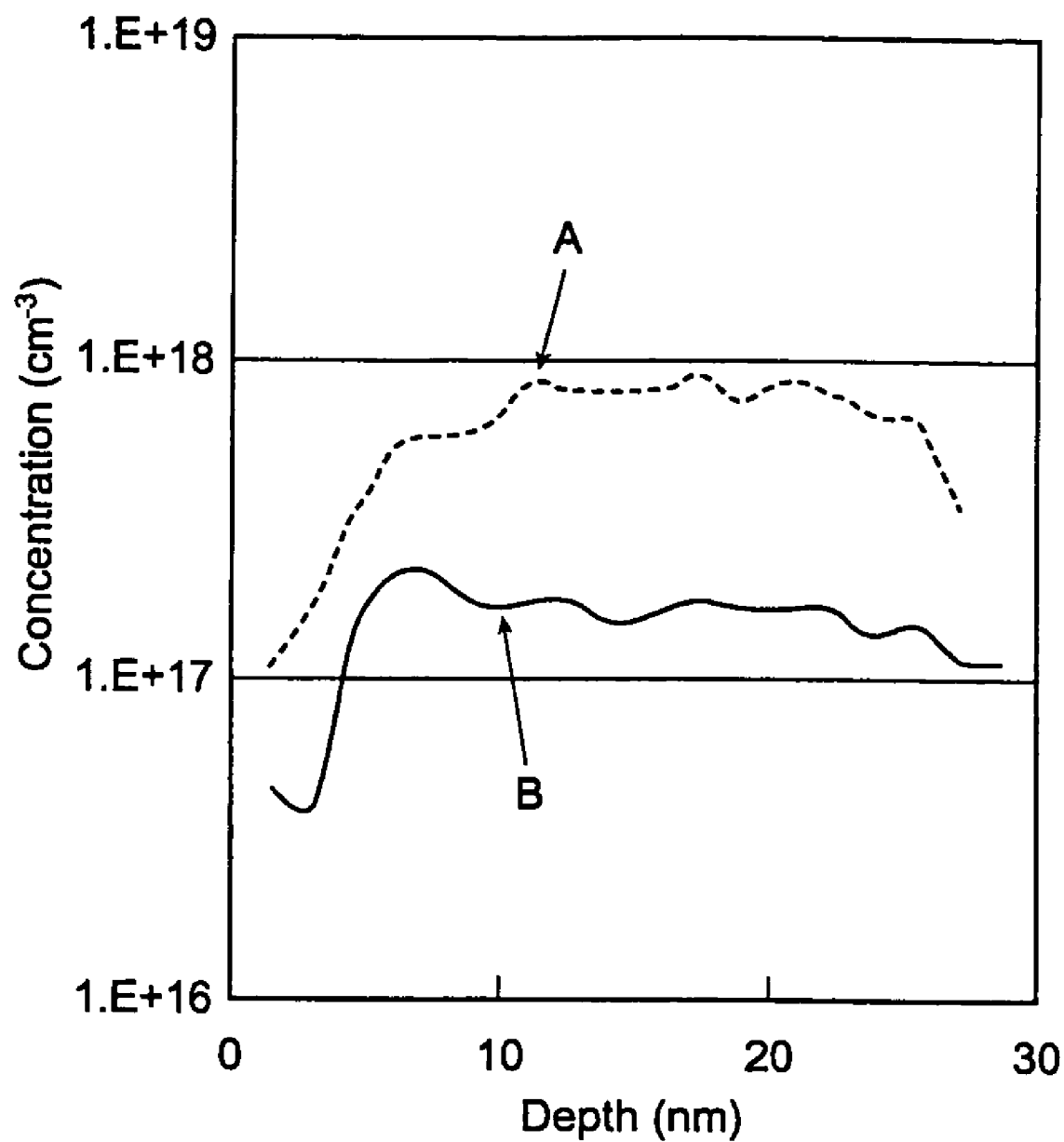
FIG. 12 is a graph schematic showing results of a SIMS analysis of an element in an exemplary embodiment.

Effect of the present Working Example will be described according to the drawings. FIG. 12 shows results of analysis of a phosphor element in a silicon thin film transistor through secondary ion mass spectrometry (SIMS) analysis. In FIG. 12, the axis of abscissa represents depth from the surface of the silicon thin film transistor, while the axis of ordinate represents concentration of the phosphor element. Broken line A therein shows a profile of the phosphor element when the present Working Example is not applied, that is, in a case where the termination processing (the third step) by hydrogen is not performed. Solid line B shows a profile of the phosphor element according to the present working example. As compared to the case of not implementing the third step, for example, there is a decrease to about ⅕ of the transistor layer at a 20 nm position, and the concentration of the phosphor element, which is an impurity, is clearly diminished. According to the results of the present analysis, the effect of the exemplary embodiments of decreasing impurities in the semiconductor film has been confirmed.

Figure 13:
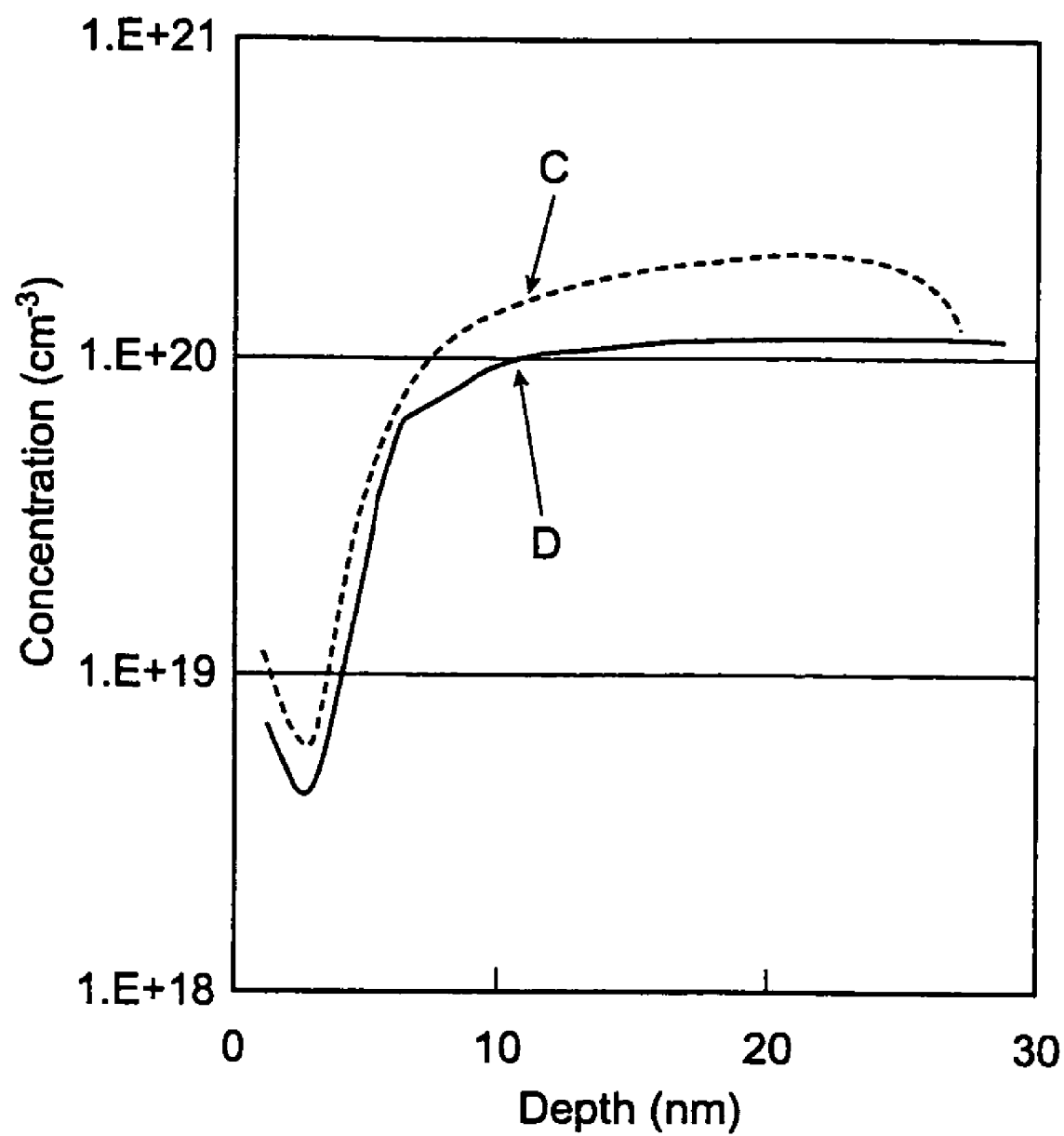
FIG. 13 is a graph schematic showing results of SIMS analysis of an element in an exemplary embodiment.

Likewise, results of SIMS analysis of carbon element are shown in FIG. 13. In FIG. 13, broken line C shows a profile of a carbon element when the present Working Example is not applied, that is, in a case where the termination processing (the third step) by hydrogen is not performed. Solid line D shows the profile of the carbon element according to the present Working Example. As compared to the case of not implementing the third step, for example, there is a decrease to about ⅚ of the transistor layer at a 20 nm position, and the concentration of the carbon element which is an impurity clearly diminished. According to the results of the present analysis, the effect of the exemplary embodiments of decreasing impurities in the semiconductor film has been confirmed.

WORKING EXAMPLE 2

A second Working Example will be described with reference to FIGS. 2A–2G and FIG. 3. FIGS. 2A–2G are process schematics explaining a second Working Example of the exemplary embodiments. In this drawing, parts corresponding to parts in FIG. 1 are given like reference numerals, explanation of such parts being omitted.

In the second Working Example, the termination processing of the surface of the semiconductor film is performed by heating under the atmosphere containing hydrogen.

Figure 2A:
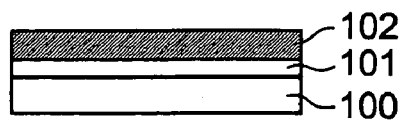
FIGS. 2A–2G are process schematics explaining a manufacturing process of a thin film transistor in Working Examples 2 and 3 in exemplary embodiments.
Figure 2B:
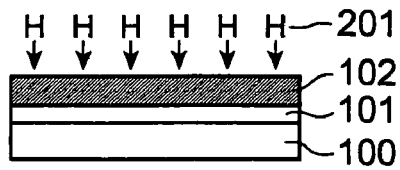
Figure 2C:
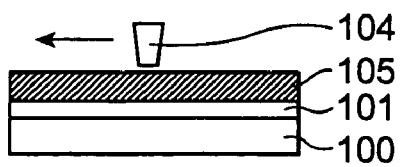
Figure 2D:
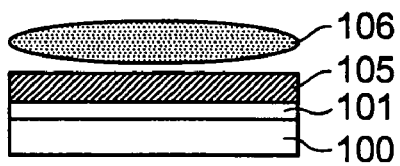
Figure 2E:
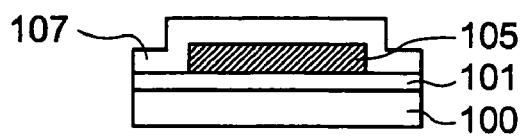
Figure 2F:
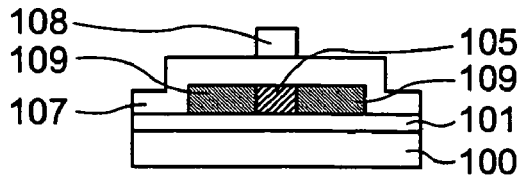
Figure 2G:
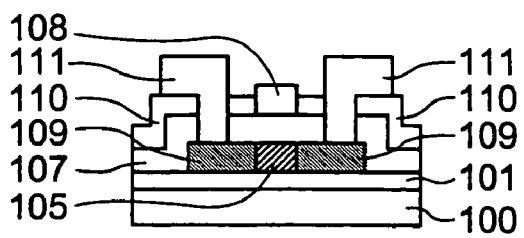

Namely, as the third step (the termination processing), the substrate is conveyed from the dehydrogenation processing chamber 300 to the termination processing chamber 301 in vacuum, while in the termination processing chamber 301, heating is performed in the atmosphere 201 containing hydrogen as shown in FIG. 2B. In the present example, there is introduced a gas having a mixture of hydrogen and nitrogen respectively at ratios of 3% and 97%. Other than nitrogen, a gas mixed with hydrogen may be an inert gas to the semiconductor layer such as helium. Further, the hydrogen gas does not need to be diluted. As for the heating temperature, if it is over 350° C. hydrogen combined on the surface separates again. The processing time may be within 20 minutes in consideration of tact time. By way of such heating method, the surface of the amorphous silicon film may be sufficiently inactivated. Since the dehydrogenation processing chamber 300 and the termination processing chamber 301 have different temperature settings, the settings for different chambers may be made in consideration of the tact time. Other steps are the same as the first Working Example (FIGS. 1A–1G).

According to the present example, it is possible to terminate with hydrogen the dangling bond on the surface of the semiconductor film from which hydrogen has been removed, and to discourage or prevent impurities existing in air and in the atmosphere in the semiconductor manufacturing apparatus from combining on the surface of the semiconductor film.

WORKING EXAMPLE 3

Figure 4:
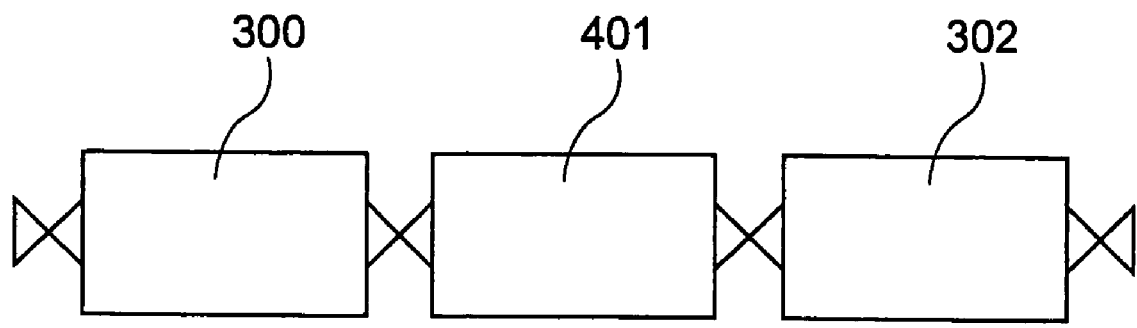
FIG. 4 is an explanatory schematic explaining transfer of devices among processes in Working Example 3 in an exemplary embodiment.

A third Working Example will be described with reference to FIGS. 2A–2G and FIG. 4. FIG. 4 is an explanatory schematic explaining transfer of devices among the processes. In this drawing, parts corresponding to parts in FIG. 3 are given like reference numerals, explanation of such parts being omitted.

In the third Working Example, the termination processing of the surface of the semiconductor film is performed by exposure thereof under the atmosphere containing hydrogen.

Namely, as the third step (the termination processing), the substrate is taken out of the dehydrogenation processing chamber 300 and conveyed to the light irradiation chamber 302 through a conveying chamber 401 shown in FIG. 4 in vacuum (under the decompressed environment). At this time, the conveying room 401 has the atmosphere 201 containing hydrogen. In the present example, there is in the chamber a gas having a mixture of hydrogen and nitrogen respectively at ratios of 3% and 97%. Other than nitrogen, a gas mixed with hydrogen may be an inert gas to the semiconductor layer such as helium. Further, the hydrogen gas does not need to be diluted. Since the substrate taken out of the dehydrogenation processing chamber has a high temperature of about 400° C., only by passing through the conveying chamber, the surface of the semiconductor layer is inactivated by hydrogen, and the termination processing is carried out. Other steps are the same as the first Working Example (FIGS. 1A–1G).

According to the present example, it is possible to terminate with hydrogen the dangling bond on the surface of the semiconductor film from which hydrogen has been removed, and to prevent or discourage impurities existing in air and in the atmosphere in the semiconductor manufacturing apparatus from combining on the surface of the semiconductor film.

WORKING EXAMPLE 4

A fourth Working Example will be described with reference to FIGS. 5A–5G and FIG. 3. FIGS. 5A–5G are process schematics explaining the fourth Working Example of the exemplary embodiments. In this drawing, parts corresponding to parts in FIGS. 1A–1G are given like reference numerals, explanation of such parts being omitted.

In the fourth Working Example, the termination processing of the surface of the semiconductor film is performed by exposure thereof under oxygen plasma.

Figure 5A:
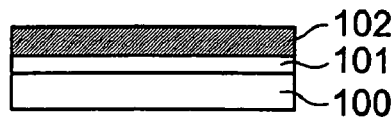
FIGS. 5A–5G are process schematics explaining a manufacturing process of a thin film transistor in Working Example 4 in an exemplary embodiment.
Figure 5B:
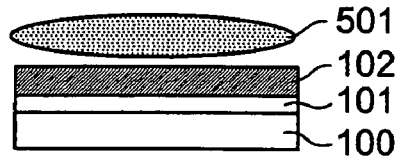
Figure 5C:
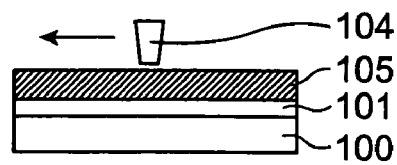
Figure 5D:
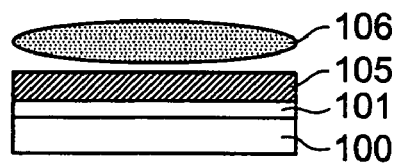
Figure 5E:
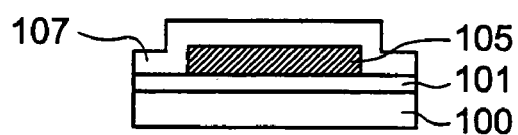
Figure 5F:
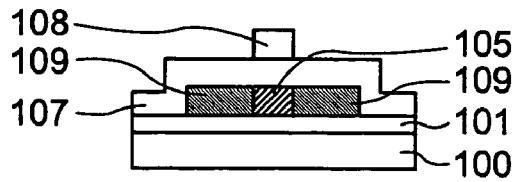
Figure 5G:
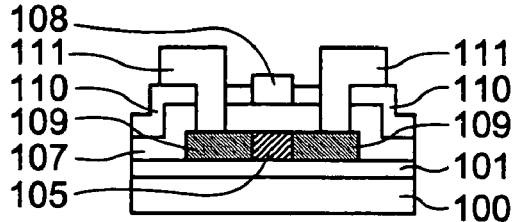

Namely, as the third step (the termination processing), the substrate is conveyed from the dehydrogenation processing chamber 300 and conveyed to the termination processing chamber 301, and oxygen plasma processing 501 is performed to the amorphous silicon film 102 as shown in FIG. 5B. First, the substrate is set in the plasma processing chamber, and oxygen gas is introduced therein. The 99.999% oxygen gas is introduced from the mass flow controller and the gas flow rate is 1000 sccm. Pressure in the processing chamber is adjusted to be 1 torr. Once the gas pressure in the chamber is stabilized, RF discharge is started, cleaning the surface of the amorphous silicon film by oxygen plasma processing 501 and it is oxidized. By this processing, termination is made with oxygen. The substrate temperature is 350° C. and the RF power to be charged is 0.1 W/cm$^2$. By the generated active seed, the surface of the amorphous silicon film is sufficiently inactivated in a processing time of 120 seconds. This enables the oxide silicon film to be formed on the surface of the amorphous silicon film. However, if film thickness of the oxide silicon film is too thick, crystallization will be impeded in laser irradiation at the next step, so that the oxide silicon film may be formed to be less than 2 nm.

Figure 11A:
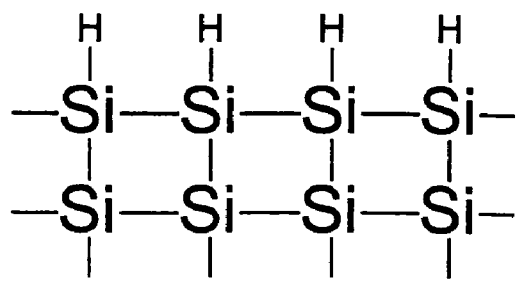
FIGS. 11A–11D are explanatory schematics explaining termination processing in an exemplary embodiment.
Figure 11B:
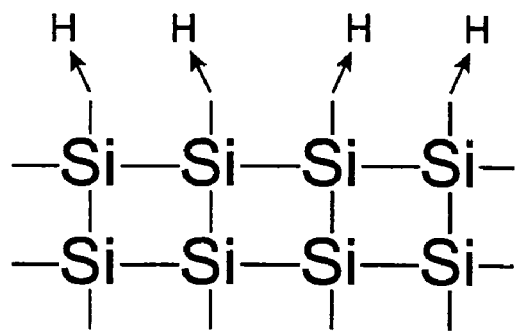
Figure 11C:
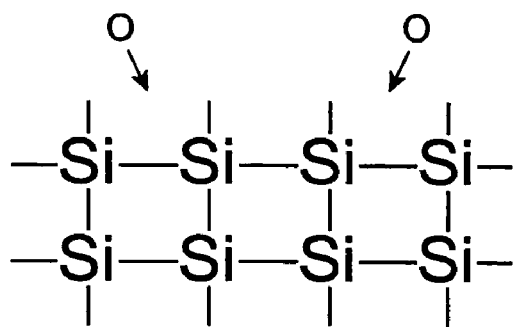
Figure 11D:
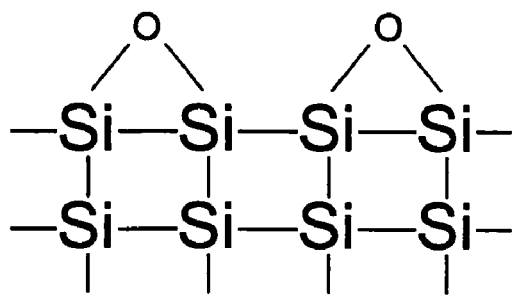

Referring to FIGS. 11A–11D, removal of hydrogen by the second step (dehydrogenation processing) and termination processing of the semiconductor layer through oxygen by the present third step (termination processing) will be described. At the dangling bond of the silicon atoms of silicon formed under an environment which may contain hydrogen, as shown in FIG. 11A, hydrogen elements are combined with silicon elements. In this condition, dehydrogenation processing is performed as shown in FIG. 11B, hydrogen atoms on the surface of the semiconductor layer are removed and the surface is activated, whereas termination is made with oxygen elements existing in the atmosphere as shown FIG. 11C and FIG. 11D. Other steps are the same as the first Working Example (FIGS. 1A–1G).

According to the present Working Example, the dangling bond on the surface of the semiconductor layer from which hydrogen is removed is terminated, so that the impurities contained in the atmosphere may be prevented from combining on the surface of the semiconductor layer.

WORKING EXAMPLE 5

A fifth Working Example will be described with reference to FIGS. 6A–6G. FIGS. 6A–6G are process schematics explaining a manufacturing process of a thin film transistor of the fifth Working Example of the exemplary embodiments.

The fifth Working Example uses an 8-inch quartz glass substrate 600 for a substrate. Further, in the fifth Working Example, termination processing of the surface of the semiconductor layer is performed by hydrogen.

Figure 6A:
FIGS. 6A–6G are process schematics explaining a manufacturing process of a thin film transistor in Working Example 5 in an exemplary embodiment.

The 8-inch quartz glass substrate 600 is used as a substrate. As the first step, as shown in FIG. 6A, an amorphous silicon film 601 is first deposited for about 50 nm by the low-pressure CVD process.

Figure 6B:

Next, as shown in FIG. 6B, by heating to over 600° C., the amorphous silicon film 601 is crystallized 600 through solid phase growth. It should be noted that this heating step also serves as the second step (dehydrogenation processing) to remove hydrogen from a crystallized silicon film 602.

Figure 6C:
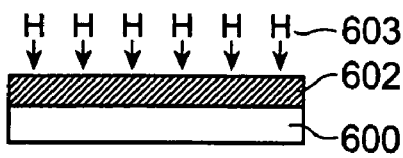

Next, as shown in FIG. 6C, without exposure to air, the substrate is conveyed to the third step (termination processing) to terminate 603 the activated surface of the crystallized silicon film 602. For this process, for example, there may be used the hydrogen plasma process as shown in the Working Example 1 or heating in the atmosphere containing hydrogen as shown in the Working Example 2, or conveying in the atmosphere containing hydrogen as shown in the Working Example 3.

Figure 6D:

Next, the substrate 600 is conveyed to the insulating film deposit chamber without exposure to air. There are introduced into the chamber silane gas and oxygen gas at a flow ratio of 1:6, and pressure in the deposit chamber is adjusted to 2×10$^{-3}$ Torr. Once the gas pressure in the chamber is stabilized, discharge is started, beginning film-making of the insulating film. The power charged is 1 kW, and microwaves are introduced through the introduction window parallel to a magnetic line of force. There is an ECR point at a position 14 cm from the introduction window. The film-making is performed at a film-making rate of 100 nm/min. By this means, as shown in FIG. 6D, a first gate insulating film 604 is deposited for 30 nm.

Figure 6E:
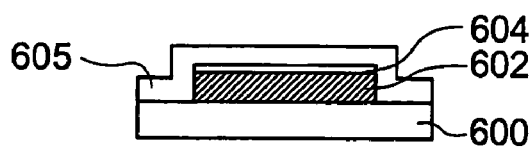
Figure 6F:
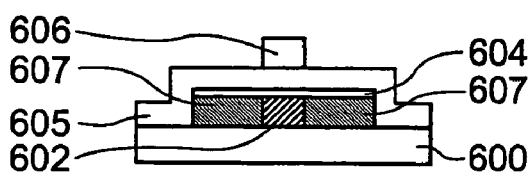

Next, as shown in FIG. 6E, etching is performed for element separation of the poly-Si film and the first gate insulating film 604, then, a second gate insulating film 605 is deposited for 80 nm, in the present example, by PECVD process at 350° C. For raw material gas, a mixed gas of TEOS and O$_2$ is used.

Next, a thin film which will become a gate electrode 606 is deposited by a process such as the PVD process and the CVD process. Since the gate electrode is typically made of the same material as gate wiring in the same process, this material may have a low electric resistance and may be stable against a heating process of about 350° C. In the present example, a tantalum thin film having a thickness of 600 nm is deposited by the sputtering process. A substrate temperature when depositing the tantalum thin film is 180° C., and argon gas containing 6.7% of nitrogen gas is used for sputtering gas. The tantalum thin film deposited in this manner has a crystal structure of α structure and its specific resistance is approximately 40 μΩcm. Next, patterning is performed, after depositing, on the thin film which is to become a gate electrode, and subsequently, an ion injection of impurities is performed on the semiconductor film to form a source/drain area 607 and a channel area 602. Since the gate electrode serves as a mask for the ion injection at this time, the channel has become a self-aligned structure to be formed only under the gate electrode. For raw material gas of the ion doping process, there is employed a hydrogen compound of injection impurities such as phosphine (PH$_3$) and diborane (B$_2$H$_6$) of a concentration of approximately 0.1% to 10%, which is diluted in hydrogen. In the present example, aiming at formation of NMOS, the ion doping device is used to inject phosphine (PH$_3$) of a 5% concentration diluted in hydrogen at an acceleration voltage of 100 keV. The total quantity of ion injection including PH$_3^+$ and H$_2^+$ ions is 1×10$^{16}$ cm$^{-2}$.

Figure 6G:
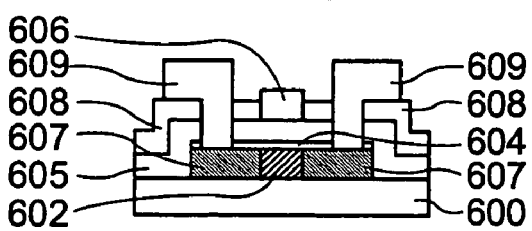
Figure 7A:
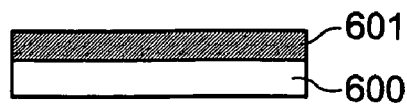
FIGS. 7A–7G are process schematics explaining a manufacturing process of a thin film transistor in Working Example 6 in an exemplary embodiment.
Figure 7B:
Figure 7C:
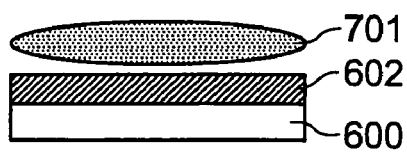
Figure 7D:
Figure 7E:
Figure 7F:
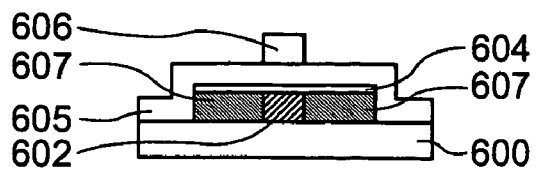
Figure 7G:
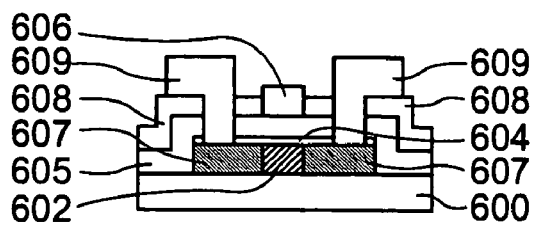

Next, as shown in FIG. 6G, an interlayer insulating film 608 is deposited, a contact hole is opened on a source/drain, and a source/drain take-out electrode 609 and wiring are formed by such processes as the PVD process and the sputtering process, thus completing a thin film transistor.

According to the present working example, a dangling bond on the surface of the semiconductor layer is terminated, so that the impurities of atoms and molecules contained in air or in the atmosphere of the semiconductor manufacturing apparatus may be prevented from combing on the surface of the semiconductor film.

WORKING EXAMPLE 6

A sixth working example will be described with reference to FIGS. 7A–7G. FIGS. 7A–7G are process schematics explaining the sixth Working Example of the exemplary embodiments. In this drawing, parts corresponding to parts in FIGS. 6A–6G are given like reference numerals, explanation of such parts being omitted.

The sixth Working Example uses a quartz glass substrate for substrate. Further, in the sixth Working Example, the termination processing of the surface of the semiconductor layer is performed by exposing it to oxygen plasma.

Namely, as the third step (the termination processing), an oxygen plasma processing 701 is performed to the surface of a poly-crystal silicon film which is activated. First the substrate is set in the plasma-processing chamber, and oxygen gas is introduced into this chamber. A 99.999% hydrogen gas is introduced from a mass flow controller at a gas flow rate of 1000 sccm. Pressure in the processing chamber is adjusted to be 1 torr. Once the gas pressure in the chamber is stabilized, RF discharge is started, cleaning and oxidizing the surface of the poly-crystal silicon film with oxygen plasma 701. The substrate temperature is 350° C. and the RF power to be charged is 0.1 W/cm². By the generated active seed, the surface of the amorphous silicon film is sufficiently inactivated in a processing time of 120 seconds.

The oxide silicon film formed by this oxygen plasma processing 701 becomes the first gate insulating film 604. Other steps are the same as the fifth Working Example (FIGS. 6A–6G).

According to the present working example, the dangling bond on the surface of the semiconductor layer from which hydrogen is removed is terminated, so that the impurities of atoms and molecules contained in air or in the atmosphere of the semiconductor manufacturing apparatus may be prevented from combing on the surface of the semiconductor film.

WORKING EXAMPLE 7

In the seventh Working Example, nitrogen plasma is used for terminating processing of the semiconductor layer of the above-mentioned third step. For conditions of terminating processing, for example, nitrogen gas is introduced from the mass flow controller at a gas flow rate of 1000 sccm. Pressure in the processing chamber is adjusted to be 1 Torr. Once the gas pressure in the chamber is stabilized, RF discharge is started, terminating the surface of the amorphous silicon film with nitrogen. For example, the substrate temperature is 350° C. and the RF power charged is 0.15 W/cm². By the generated active seed, the surface of the amorphous silicon film is sufficiently inactivated in a processing time of 10 seconds. A nitride silicon film formed by this nitrogen plasma processing may be made as a gate insulating film (part of the gate insulating film).

According to the present working example, the surface of the amorphous silicon film is terminate-processed by nitrogen atoms, so that the impurities of atoms and molecules contained in air or in the atmosphere of the semiconductor manufacturing apparatus may be prevented from combing on the surface of the semiconductor film. Other steps are the same as the working examples already mentioned.

WORKING EXAMPLE 8

In the eighth Working Example, ammonia ($NH_3$) plasma is used for terminating processing of the surface of the semiconductor of the third step. For conditions of terminating processing, for example, ammonia gas is introduced from the mass flow controller at a gas flow rate of 1000 sccm. Pressure in the processing chamber is adjusted to be 1 Torr. Once the gas pressure in the chamber is stabilized, RF discharge is started, terminating the surface of the amorphous silicon film with nitrogen or hydrogen or $NH_x$ (x is 1 or 2). For example, the substrate temperature is 350° C. and the RF power charged is 0.15 W/cm². By the generated active seed, the surface of the amorphous silicon film is sufficiently inactivated in a processing time of 10 seconds.

According to the present working example, by terminating the surface of the amorphous silicon film activated through dehydrogenation processing with at least one of nitrogen, hydrogen, or $NH_x$ (x is 1 or 2), the dangling bond of the surface of the semiconductor film from which hydrogen is removed is terminated, so that the impurities of atoms and molecules contained in air or in the atmosphere of the semiconductor manufacturing apparatus may be prevented from combing on the surface of the semiconductor film. Other steps are the same as the working examples already mentioned.

In this manner, according to the above-mentioned present working example, dehydrogenation processing of the semiconductor layer with a film made and termination processing (deactivating) of the surface of the semiconductor are consecutively performed in isolation from air, so that impurities in air and in the atmosphere of the semiconductor manufacturing apparatus may be prevented from combining on the surface of the semiconductor. Further, it is possible to prevent a defect of impurities deposited on the surface from diffusing inside the semiconductor layer in the crystallization step of the latter stage.

What is claimed is:

1. A manufacturing process of a semiconductor device, comprising:
    first forming a thin film semiconductor layer;
    second performing dehydrogenation processing to remove hydrogen from inside the semiconductor layer;
    third combining at least one of a non-inert atom and a non-inert molecule on a surface of the semiconductor layer activated by the dehydrogenation processing to terminate a connector of the surface of the semiconductor layer; and
    consecutively performing at least the second performing and the third combining under an environment isolated from air.

2. The manufacturing process of the semiconductor device according to claim 1, further comprising:
    fourth performing crystallization processing by further irradiating the semiconductor layer by light for crystallization following the third combining.

3. The manufacturing process of the semiconductor device atmosphere according to claim 2, the fourth performing including consecutively performing crystallization processing under the environment isolated from air following the third combining.

4. The manufacturing process of the semiconductor device according to claim 1, the third combining including exposing the surface of the semiconductor layer to hydrogen plasma.

5. The manufacturing process of the semiconductor device according to claim 1, the third combining including heating the surface of the semiconductor layer in an atmosphere containing hydrogen.

6. The manufacturing process of the semiconductor device according to claim 1, the third combining including exposing the surface of the semiconductor layer to the atmosphere containing hydrogen.

7. The manufacturing process of the semiconductor device according to claim 1, the third combining including exposing the surface of the semiconductor layer to oxygen plasma.

8. The manufacturing process of a semiconductor device according to claim 1, the third combining including exposing the surface of the semiconductor layer to nitrogen plasma.

9. The manufacturing process of the semiconductor device according to claim 1, the third combining including exposing the surface of the semiconductor layer to ammonia plasma.

10. The manufacturing process of the semiconductor device according to claim 1, the third combining including exposing the surface of the semiconductor layer to phosphine.

11. The manufacturing process of the semiconductor device according to claim 1, the third combining including exposing the surface of the semiconductor layer to diborane.

* * * * *